C. E. MARK.

Assignor, by mesne assignments to THE MARK'S AUTOMATIC CAR COUPLER COMPANY.

CAR COUPLING.

No. 10,702. Reissued Mar. 23, 1886.

WITNESSES:

W. T. Robertson

E. A. Bond

INVENTOR

Charles E. Mark

BY T. W. Robertson

ATTORNEY.

N. PETERS, Photo-Lithographer, Washington, D. C.

UNITED STATES PATENT OFFICE.

CHARLIE E. MARK, OF FLINT, MICHIGAN, ASSIGNOR, BY MESNE ASSIGNMENTS, TO THE MARK'S AUTOMATIC CAR COUPLER COMPANY, OF CLEVELAND, OHIO.

CAR-COUPLING.

SPECIFICATION forming part of Reissued Letters Patent No. 10,702, dated March 23, 1886.

Original No. 275,054, dated April 3, 1883. Application for reissue filed January 31, 1884. Serial No. 119,413.

*To all whom it may concern:*

Be it known that I, CHARLIE E. MARK, of Flint, in the county of Genesee and State of Michigan, have invented new and useful Improvements in Car-Couplings; and I do hereby declare that the following is a full, clear, and exact description thereof, reference being had to the accompanying drawings, which form a part of this specification.

My invention relates to certain new and useful improvements in "car-couplers."

It has for its objects to provide direct draft on the car, accuracy and positiveness in coupling, and the vibration of the rear end of the draw-bar to couple and uncouple; and with these objects in view my invention consists in the peculiar construction and operation hereinafter fully set forth and specifically claimed.

In order that those skilled in the art to which the invention appertains may know how to make and use the same, I will proceed to describe the construction and operation, referring by letters to the accompanying drawings, in which—

Figure 1:
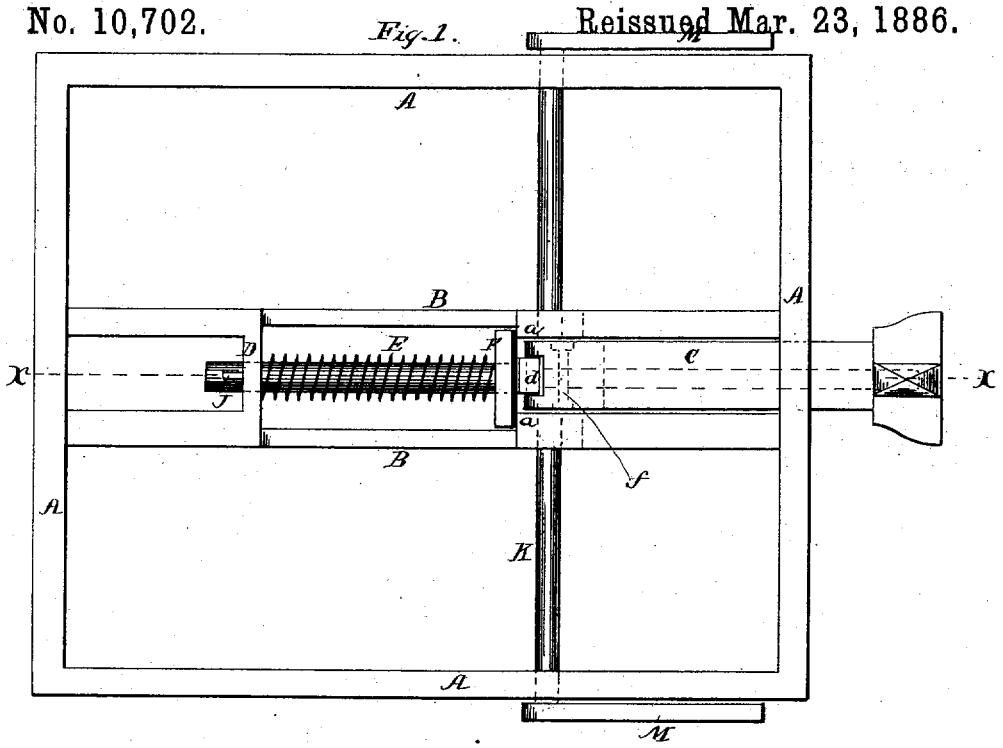
Figure 2:
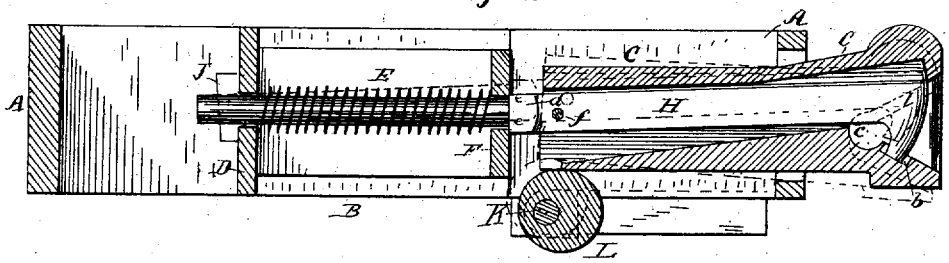
Figure 3:
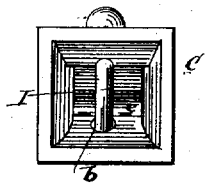

Figure 1 is a plan view of one end of the car-frame with my improved coupler attached. Fig. 2 is a longitudinal vertical section taken at the line *x x* of Fig. 1; and Fig. 3 is a front or end view of the draw-bar.

Similar letters denote like parts in the several figures.

A represents a portion of the car-frame, formed with longitudinal pieces B B to serve as guides for the buffer-box C, and partition D, to support one end of a spiral spring, E, the opposite end of which is confined against a loose partition, F, which is free to move longitudinally as the spring contracts and expands.

C is the buffer-box, the peculiar construction of which will be presently explained. This buffer-box is arranged to pass through the end of the frame A, and is located between the pieces B B, which have inwardly-projecting shoulders *a a*, as seen at Fig. 1, against which the loose partition F rests when the spring E is in its normal condition. The buffer-box is formed with a flaring mouth, as seen at Fig. 3, to guide and direct the coupling-link, and is cored out interiorly, as clearly shown in the section at Fig. 2, to permit of the vibration of a hook-bar, H. The lower lip of the mouth of the buffer-box is provided with a slot or recess, *b*, to receive the lower end of the hook of the bar H, and with a curved seat, *c*, against which the end of the coupling-link strikes. The hook-bar H is formed at its front end into a hook, I, curved as shown, so that the contact and pressure of the end of the link will cause said hook end to rise and permit the passage of the link, when the hook I will immediately fall and grasp the link. That part of the bar H confined within the buffer-box is flattened or rectangular in cross-section, and immediately in the rear of the back end of the buffer-box is enlarged to form a curved shoulder, *d*, next to the buffer-box, and a square or flat shoulder, *e*, adjacent to the loose partition, F, the remainder of the bar being round and passing through the central holes in the loose and fixed partitions F D, and secured in place by a key, J, back of the partition D, the spring E, surrounding the rounded end of the bar H, being confined between the two partitions, and tending to keep the partition F always in place against the shoulders *a a*, and as the bar H is pivoted to the buffer-box at *f* the draw-bar is consequently kept forward, as clearly shown at Figs. 1 and 2, the spring yielding when the buffer-boxes of adjacent cars come in contact. The pivot *f* is at the rear end, as clearly shown, and the greatest weight of the buffer-box being behind the front of the frame, (which serves as a rest or support for the front end,) the rear end of the former will fall by gravity until it comes in contact with the top surface of the bar H in the rear of the pivot, and thus bring the hook end I with relation to the mouth of the buffer-box into the position seen at Fig. 2, ready to be acted upon by the coupling-link, which, when it strikes the front thereof, is forced down against the lower lip and by pressure at such point lifts the rear end of the buffer-box, which causes the front end to recede from the hook I and open a channel for the passage of the link, as seen in dotted lines in Fig. 2, and as soon as it reaches its seat *c* the rear weight of the buffer-box causes it to resume its normal position and to confine the link in an obvious manner.

In order that the link may be released when desired to uncouple, I provide a rock-shaft, K, passing below the bottom surface of the draw-head, and on the said rock-shaft is arranged a cam or eccentric, L, adapted to come in contact with the lower surface of the buffer-box, so that when the shaft K is rocked the buffer-box will be lifted, said motion being imparted by lever or crank arms M, or in any other suitable manner. The shoulders *e e* of the bar H resting against one side of the movable partition F, and the end of the spring E against the opposite side, it will be readily seen how the spring serves as a bumper and returns the buffer-box to its place. The shoulders *d* on the bar H are curved in order to permit the vertical movement of the rear end of the buffer-box. The recess *b* in the lower lip of the buffer-box supports the free end of the hook, and secures it against being straightened out by the strain.

It will be observed that the partition F is free to rise when the end of the draw-head C is lifted. The hook-bar, also rising and moving on a radius greater than the buffer-box, necessarily opens a passage at the front end for the link.

What I claim as my invention is—

1. In a car-coupling as described, the buffer-box, combined with a hooked draw-bar arranged within and having its rear end projected through the rear end of the said buffer-box, the draw-bar having an enlargement, *d*, against which the buffer-box abuts to keep said box out of contact with spring, as set forth.

2. In a car-coupling, a hollow buffer-box, combined with a hooked draw-bar supported therein, the said buffer-box bearing against an enlargement, *d*, on the draw-bar and being adapted to move with said draw-bar as it is projected or retracted, as set forth.

3. In a car-coupling, the combination, with a hollow buffer-box and a hooked draw-bar supported therein, of means, as L, for raising the rear end of the buffer-box to disconnect the link from the draw-bar in uncoupling, as set forth.

4. In a car-coupling, the hollow buffer-box, and means, as K L, for raising its rear end, combined with a hooked draw-bar supported in said box, and with a buffer-spring acting upon the bar and out of contact with the buffer-box, as set forth.

5. In a car-coupling constructed substantially as described, the draw-bar H, provided with shoulders *e e*, substantially as and for the purposes described.

6. In a car-coupling, and in combination with a bar, H, provided with the shoulders *e e*, the vertical movable partition F, and the spring E, substantially as and for the purposes described.

7. In a car-coupling constructed substantially as described, the bar H, provided with shoulders *e e* and *d*, said bar being pivoted within and near the rear end of a hollow buffer-box, substantially as and for the purposes specified.

8. In combination with the hook-bar H, formed at its front end in a hook, the buffer-box C, cored or recessed interiorly and pivoted near its back end to the bar H, substantially as and for the purposes set forth.

9. The buffer-box C and bar H, arranged between guides B B in the frame A, in combination with the rigid partition D, vertical and longitudinally-movable partition F, spring E, and key J, arranged and operating as set forth.

10. The buffer-box C and hooked bar H, pivoted together, as described, and arranged within the guides B B on the frame A, in combination with mechanism for lifting the rear end of the stuffer-box, substantially as and for the purposes described.

CHARLIE E. MARK.

Witnesses:
H. S. SPRAGUE,
JAY CLARK.